(12) United States Patent
Park

(10) Patent No.: US 10,746,804 B2
(45) Date of Patent: Aug. 18, 2020

(54) BATTERY MANAGEMENT METHOD AND APPARATUS

(71) Applicant: SAMSUNG ELECTRONICS CO., LTD., Suwon-si (KR)

(72) Inventor: Jeonghyun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 15/720,161

(22) Filed: Sep. 29, 2017

(65) Prior Publication Data

US 2018/0203070 A1 Jul. 19, 2018

(30) Foreign Application Priority Data

Jan. 18, 2017 (KR) ........................ 10-2017-0008450

(51) Int. Cl.
| | | |
|---|---|---|
| *G01R 31/3842* | (2019.01) | |
| *G01R 31/36* | (2020.01) | |
| *H02J 7/00* | (2006.01) | |
| *H01M 10/48* | (2006.01) | |
| *G01R 31/367* | (2019.01) | |
| *G01R 31/389* | (2019.01) | |
| *G01R 31/392* | (2019.01) | |

(52) U.S. Cl.
CPC ....... *G01R 31/3842* (2019.01); *G01R 31/367* (2019.01); *G01R 31/3648* (2013.01); *G01R 31/389* (2019.01); *G01R 31/392* (2019.01); *H01M 10/48* (2013.01); *H02J 7/0021* (2013.01); *G01R 31/3646* (2019.01)

(58) Field of Classification Search
CPC ............. G01R 31/3842; G01R 31/392; G01R 31/367; G01R 31/389; G01R 31/3648; G01R 31/3646; H01M 10/48; H02J 7/0021
USPC ........................................................ 320/132
See application file for complete search history.

(56) References Cited

U.S. PATENT DOCUMENTS

| | | | | |
|---|---|---|---|---|
| 6,285,163 | B1 * | 9/2001 | Watanabe | ............ G01R 31/389 320/132 |
| 6,850,874 | B1 * | 2/2005 | Higuerey | ................. B23H 7/20 703/4 |
| 6,924,623 | B2 * | 8/2005 | Nakamura | ........... G01R 31/389 320/132 |

(Continued)

FOREIGN PATENT DOCUMENTS

| | | |
|---|---|---|
| CN | 101504443 A | 8/2009 |
| CN | 103941191 A | 7/2014 |

(Continued)

OTHER PUBLICATIONS

Extended European Search Report dated Jun. 25, 2018, in corresponding European Application No. 18151184.1 (11 pages, in English).

*Primary Examiner* — M Baye Diao
(74) *Attorney, Agent, or Firm* — NSIP Law

(57) ABSTRACT

A method of managing a battery includes preprocessing a voltage data sequence and a current data sequence of a battery; estimating an internal resistance of the battery based on the preprocessed voltage data sequence, the preprocessed current data sequence, and an internal resistance estimation model in which an internal resistance change due to a battery degradation is modeled; and determining state information of the battery based on the estimated internal resistance.

22 Claims, 13 Drawing Sheets

(56) References Cited

U.S. PATENT DOCUMENTS

| | | | | |
|---|---|---|---|---|
| 7,197,487 | B2* | 3/2007 | Hansen | G01R 31/367 706/25 |
| 7,443,139 | B2* | 10/2008 | Mitsui | G01R 31/3842 320/134 |
| 7,482,784 | B2* | 1/2009 | Nagaoka | H02J 7/0047 320/132 |
| 7,554,296 | B2 | 6/2009 | Mizuno et al. | |
| 7,830,119 | B2* | 11/2010 | Naik | H01M 10/48 320/132 |
| 7,902,828 | B2 | 3/2011 | Huang | |
| 8,482,254 | B2 | 7/2013 | Ho | |
| 8,519,674 | B2* | 8/2013 | Anderson | G01R 31/392 320/132 |
| 8,536,872 | B2* | 9/2013 | Ueda | G01R 31/3648 324/430 |
| 8,963,551 | B2 | 2/2015 | Ishishita | |
| 8,965,721 | B2 | 2/2015 | Paryani | |
| 9,013,151 | B2* | 4/2015 | Tabuchi | G01R 31/3648 320/132 |
| 9,132,745 | B1* | 9/2015 | Lee | B60L 15/20 |
| 9,297,859 | B2* | 3/2016 | Mukaitani | G01R 31/3842 |
| 9,599,676 | B2* | 3/2017 | Okada | H01M 10/44 |
| 9,846,195 | B2* | 12/2017 | Lee | G01R 31/389 |
| 10,046,664 | B2* | 8/2018 | Komiyama | H01M 10/48 |
| 10,079,087 | B2* | 9/2018 | Matsumoto | H01F 7/1844 |
| 10,205,335 | B2* | 2/2019 | Sakata | H01M 10/48 |
| 10,365,330 | B2* | 7/2019 | Mayr | G01R 31/382 |
| 2006/0082375 | A1 | 4/2006 | Coates | |
| 2011/0299564 | A1* | 12/2011 | Leutheuser | H01M 10/443 374/134 |
| 2013/0322488 | A1* | 12/2013 | Yazami | G01N 27/27 374/142 |
| 2014/0199569 | A1* | 7/2014 | Sisk | B60L 3/0046 429/91 |
| 2014/0210262 | A1* | 7/2014 | Yaegaki | B60K 6/48 307/10.1 |
| 2014/0347059 | A1 | 11/2014 | Sato et al. | |
| 2015/0070024 | A1 | 3/2015 | Kim et al. | |
| 2015/0165921 | A1 | 6/2015 | Paryani | |
| 2015/0226812 | A1 | 8/2015 | Gajewski et al. | |
| 2015/0355288 | A1* | 12/2015 | Yokoyama | H02J 7/1461 702/63 |
| 2016/0011274 | A1* | 1/2016 | Morita | B60L 58/16 702/63 |
| 2016/0116546 | A1 | 4/2016 | Sung et al. | |
| 2016/0187432 | A1* | 6/2016 | Saint-Marcoux | G01R 31/392 702/63 |
| 2016/0195587 | A1* | 7/2016 | Lee | G01R 31/392 702/63 |
| 2016/0209472 | A1* | 7/2016 | Chow | B60L 58/12 |
| 2016/0231386 | A1 | 8/2016 | Sung et al. | |
| 2016/0239759 | A1* | 8/2016 | Sung | H01M 10/48 |
| 2016/0299197 | A1* | 10/2016 | Kim | B60L 58/10 |
| 2016/0327613 | A1* | 11/2016 | Tenmyo | H02J 7/008 |
| 2016/0372935 | A1* | 12/2016 | Sakata | H02J 7/0021 |
| 2017/0205468 | A1* | 7/2017 | Park | H01M 10/425 |

FOREIGN PATENT DOCUMENTS

| | | |
|---|---|---|
| DE | 10 2010 055 597 A1 | 8/2011 |
| EP | 2 975 421 A1 | 1/2016 |
| GB | 2 444 511 A | 6/2008 |
| JP | 2012-112866 | 6/2012 |
| JP | 2014-109535 A | 6/2014 |
| JP | 5554310 B2 | 7/2014 |
| JP | 2015-143083 A | 8/2015 |
| JP | 2015-227803 A | 12/2015 |
| KR | 10-2008-0073382 A | 8/2008 |
| KR | 10-2014-0052658 A | 5/2014 |
| KR | 10-2016-0040887 A | 4/2016 |
| KR | 10-2016-0063698 A | 6/2016 |
| KR | 10-2016-0067551 A | 6/2016 |

\* cited by examiner

500

BATTERY MANAGEMENT METHOD AND APPARATUS

CROSS-REFERENCE TO RELATED APPLICATION(S)

This application claims the benefit under 35 USC § 119(a) of Korean Patent Application No. 10-2017-0008450 filed on Jan. 18, 2017, in the Korean Intellectual Property Office, the entire disclosure of which is incorporated herein by reference for all purposes.

BACKGROUND

1. Field

The following description relates to battery management method and apparatus.

2. Description of Related Art

An internal resistance of a battery cell may, under certain circumstances, be measured using an electrochemical impedance spectroscopy (EIS). In such measurement method, the internal resistance may, generally, only be measured when the battery cell is in a stable state instead of a state in which a current is applied to the battery cell. For this reason, it is difficult to measure the internal resistance of the battery cell while the current is applied to the battery cell.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of managing a battery, the method including preprocessing a voltage data sequence and a current data sequence of a battery, estimating an internal resistance of the battery based on the preprocessed voltage data sequence, the preprocessed current data sequence, and an internal resistance estimation model in which an internal resistance change due to a battery degradation is modeled, and determining state information of the battery based on the estimated internal resistance.

In response to a battery set including batteries being provided, the preprocessing may include preprocessing a voltage data sequence of each of the batteries and a current data sequence of the battery set including the batteries, and the estimating may include inputting the preprocessed current data sequence of the battery set to internal resistance estimation models, inputting the preprocessed voltage data sequence of each of the batteries to internal resistance estimation models corresponding to the batteries among the internal resistance estimation models, and estimating an internal resistance of each of the batteries.

The estimating may include estimating the internal resistance of the battery in which a current is flowing using an internal resistance estimation model corresponding to the battery and estimating an internal resistance associated with the battery degradation instead of an internal resistance associated with the current.

The voltage data sequence may correspond to a series of pieces of voltage data of the battery, the current data sequence may correspond to a series of pieces of current data of the battery, and the estimated internal resistance of the battery may be an internal resistance estimated at a point in time corresponding to a time index of last voltage data of the voltage data sequence and a time index of last current data of the current data sequence.

The internal resistance estimation model may be trained based on a reference value and an estimated value, the reference value may be included in a reference value set determined based on an interpolation result of internal resistances measured in the reference battery in which degradation is accelerated, and the estimated value may correspond to a result of calculation performed by an untrained internal resistance estimation model based on input data including a voltage data sequence and a current data sequence of the reference battery.

The internal resistances measured in the reference battery may include an internal resistance measured in response to the reference battery being in a stabilized state after the degradation is accelerated and an internal resistance measured in response to the degradation-accelerated reference battery being in the stabilized state after being charged or discharged.

The determining may include determining, in response to internal resistances being estimated for batteries included in a battery set, a substantially maximal value from the estimated internal resistances and determining, in response to the substantially maximal value being greater than a threshold, that an abnormality is present in the battery set.

The determining may include comparing, in response to internal resistances being estimated for batteries included in a battery set, each of the estimated internal resistances to a threshold and determining whether an abnormality is present for each of the batteries and determining state information of the battery set based on a result of the determining.

The method may further include generating feedback information on a state of the battery set based on the determined state information.

The generating of the feedback information may include polling the batteries, in response to internal resistances being estimated for batteries included in a battery set, an internal resistance estimated to be greater than a threshold among the estimated internal resistances and determining a feedback level based on a result of the polling.

The preprocessing may include normalizing the voltage data sequence and the current data sequence.

The method may further include filtering the estimated internal resistance.

In another general aspect, there is also provided a method of training an internal resistance estimation model, the method including preprocessing a voltage data sequence and a current data sequence, calculating an estimated resistance value of an internal resistance associated with a degradation in the reference battery based on the preprocessed voltage data sequence, the preprocessed current data, and an internal resistance estimation model, and training the internal resistance estimation model based on the estimated resistance value and a reference value of the internal resistance.

The voltage data sequence and the current data sequence may be based on a voltage and a current sensed during a charging or discharging of the reference battery in which a degradation is accelerated.

The method may further include accelerating a degradation in the reference battery, charging or discharging the degradation-accelerated reference battery, sensing a voltage and a current of the charged or discharged reference battery, and acquiring the voltage data sequence based on the sensed voltage and the current data sequence based on the sensed current.

The method may further include generating a reference value set including the reference value by performing a calculation based on internal resistances measured in the reference battery.

The generating may include performing an interpolation based on an internal resistance measured in the reference battery being in a stabilized state after the degradation is accelerated and an internal resistance measured in the degradation-accelerated reference battery being in the stabilized state after the degradation-accelerated reference battery is charged or discharged and generating the reference value set based on a result of the interpolation.

The estimated value may be a resistance value estimated for the internal resistance at a point in time corresponding to a time index of last voltage data of the preprocessed voltage data sequence and a time index of last current data of the preprocessed current data.

The preprocessing may include normalizing the voltage data sequence and the current data sequence.

In still another general aspect, there is also provided a battery management apparatus including a controller, and a memory configured to store at least one instruction to be executed by the controller, wherein, in response to the instruction being executed, the controller is configured to preprocess a voltage data sequence and a current data sequence of a battery, estimate an internal resistance of the battery based on the preprocessed voltage data sequence, the preprocessed current data sequence, and at least one internal resistance estimation model in which an internal resistance change due to a battery degradation is modeled, and determine state information of the battery based on the estimated internal resistance.

The battery management apparatus may be mounted on a mobile body using an electric energy as a driving force, and while the mobile body is driven by the electric energy, the controller may be configured to acquire the voltage data sequence and the current data sequence and estimate an internal resistance associated with a degraded state of the battery instead of an internal resistance due to a current associated with the electric energy.

A non-transitory computer-readable storage medium may store program instructions that, when executed by a processor, cause the processor to perform one or more of the above aspects.

Other features and aspects will be apparent from the following detailed description, the drawings, and the claims.

Figure 1:
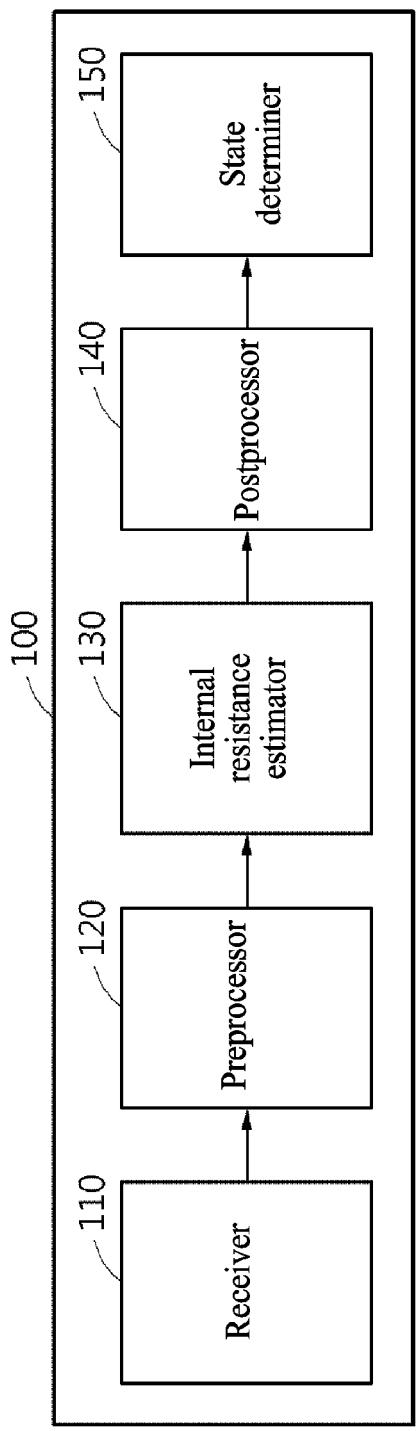
FIG. 1 illustrates an example of a battery management apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough understanding of the disclosure of this application. For example, the sequences of operations described herein are merely examples, and are not limited to those set forth herein, but may be changed as will be apparent to one of ordinary skill in the art after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinafter, reference will now be made in detail to examples with reference to the accompanying drawings, wherein like reference numerals refer to like elements throughout.

Various alterations and modifications may be made to the examples. Here, the examples are not construed as limited to the disclosure and should be understood to include all changes, equivalents, and replacements within the scope of the disclosure.

The terminology used herein is for the purpose of describing particular examples only, and is not to be used to limit the disclosure. As used herein, the terms "a," "an," and "the" are intended to include the plural forms as well, unless the context clearly indicates otherwise. As used herein, the terms "include, "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

When describing the examples with reference to the accompanying drawings, like reference numerals refer to like constituent elements and a repeated description related thereto will be omitted. When it is determined detailed description related to a related known function or configuration they may make the purpose of the examples unnecessarily ambiguous in describing the examples, the detailed description will be omitted here.

FIG. 1 illustrates an example of a battery management apparatus.

Referring to FIG. 1, a battery management apparatus 100 includes a receiver 110, a preprocessor 120, an internal resistance estimator 130, a postprocessor 140, and a state determiner 150.

The receiver 110, the preprocessor 120, the internal resistance estimator 130, the postprocessor 140, and the state determiner 150 are implemented, according to an embodiment, by at least one processing device, for example, a controller.

The receiver 110 receives voltage data and current data of at least one battery. The battery may be, for example, a battery cell or "battery" (e.g. 18650 cylindrical jelly-roll or swiss-roll type cell, though other suitable packaging arrangements may be used), a battery module (e.g. 4S1P-4series1parallel, 8S2P, etc. of e.g. 18650 cells encased, interconnected, with terminals), or a battery pack or "battery set" (comprising multiple battery modules or cells interconnected, coupled with one or more sensors and, according to embodiments, a controller). In an embodiment, the receiver 110 receives voltage data for each 18650 cell in a battery module individually, and a single current for the entire battery pack or battery module.

The receiver 110 receives the voltage data of the battery from a voltage sensor and receives the current data of the battery from a current sensor. The voltage sensor transmits voltage data that is generated by sensing a voltage of the battery at an interval of a sensing period, for example, one second, to the battery management apparatus 100, and the receiver 110 receives the voltage data of the battery from the voltage sensor of the battery. The current sensor transmits current data that is generated by sensing a current of the battery (battery pack) at an interval of a sensing period, for example, one second, to the battery management apparatus 100, and the receiver 110 receives the current data of a battery set from the current sensor. The current of the battery may be a current flowing into the battery or a current to be output from the battery. For example, the current of the battery may be a charging current for charging the battery or a discharging current of the battery.

When the receiver 110 sequentially receives the voltage data from the voltage sensor of the battery, a voltage data sequence of the battery is generated in the receiver 110. The voltage data sequence is, for example, a series of pieces of voltage data indexed in a time order or having a time index. Also, when the receiver 110 sequentially receives the current data from the current sensor, a current data sequence of the battery may be generated in the receiver 110. The current data sequence is, for example, a series of pieces of current data indexed in a time order or having a time index.

The preprocessor 120 preprocesses the voltage data sequences of the cells and the current data sequence of the battery pack. For example, the preprocessor 120 normalizes the voltage data sequences and the current data sequence of the battery pack.

The internal resistance estimator 130 estimates an internal resistance (IR) of the battery. The internal resistance estimator 130 estimates the internal resistance of each cell of the battery pack based on the preprocessed voltage data sequences, the preprocessed current data sequence, and at least one internal resistance estimation model. The internal resistance estimation model is an internal resistance estimation model that has been trained based on at least a reference value and an estimated value. In this example, the reference value is a value included in a reference value set determined based on an interpolation result of internal resistances measured in a reference battery of which a degradation is accelerated. Also, the estimated value corresponds to a result of calculation performed by an untrained internal resistance estimation model based on input data including a voltage data sequence and a current data sequence of the reference battery.

When a battery set includes plural batteries, the internal resistance estimator 130 estimates internal resistances of each of the batteries based on a voltage data sequence preprocessed for each of the batteries and a preprocessed current data sequence of the battery set including the batteries, and at least one internal resistance estimation model. An example of estimating the internal resistance for each of the batteries included in the battery set is also be described with reference to FIG. 2.

The postprocessor 140 postprocesses the estimated internal resistance of the battery. The postprocessor 140 includes, for example, a moving average filter or a low pass filter. Noise of the estimated internal resistance may be removed through the postprocessing.

The state determiner 150 determines state information of the battery based on the estimated internal resistance of the battery. The determined state information indicates, for example, an abnormal state or a normal state. When the estimated internal resistance is greater than a threshold, the state determiner 150 determines the state information of the battery as the abnormal state.

When the internal resistance estimator 130 estimates the internal resistance for each of the batteries with respect to the battery set including the batteries, the state determiner 150 determines a maximal value from the estimated internal resistances. When the maximal value is greater than a threshold, the state determiner 150 determines that an abnormality is present in the battery set. For example, when internal resistances of n batteries at a point in time t are estimated as $R_{d1\_t}, R_{d2\_t}, \ldots, R_{dn\_t}$, the state determiner 150 determines a maximal value from $R_{d1\_t}, R_{d2\_t}, \ldots, R_{dn\_t}$. When $R_{dt\_t}$ is determined as the maximal value, the state determiner 150 compares $R_{dt\_t}$ to the threshold. When $R_{d1\_t}$ is greater than the threshold, the state determiner 150 determines that an abnormality is present in the battery set. As such, the state determiner 150 determines the state information of the battery set to be the abnormal state when $R_{d1\_t}$ is greater than the threshold.

When the internal resistance estimator 130 estimates the internal resistance for each of the batteries with respect to the battery set including the batteries, the state determiner 150 compares the estimated internal resistance to the threshold and determines whether an abnormality is present for each of the batteries. The state determiner 150 determines the state information of the battery set based on whether an abnormality is present for each of the batteries. For example, when internal resistances of n batteries at a point in time t are estimated as $R_{d1\_t}, R_{d2\_t}, \ldots, R_{dn\_t}$, the state determiner 150 compares $R_{d1\_t}, R_{d2\_t}, \ldots, R_{dn\_t}$ to the threshold. In this example, when $R_{d1\_t}, R_{d2\_t}$, and $R_{d3\_t}$ are greater than the threshold, the state determiner 150 determines that an abnormality is present in a battery_1 corresponding to $R_{dt\_t}$, a battery_2 corresponding to $R_{d2\_t}$, and a battery_3 corresponding to $R_{d3\_t}$. The state determiner 150 determines that the abnormality is present in at least one battery and thus, determines a state of the battery set to be the abnormal state.

Comparison may be made based on equal to, approaching, or greater than the threshold mutatis mutandis.

The state determiner 150 generates feedback information on a current state of the battery set based on the state information of the battery set. In response to the state information being determined as the abnormal state, the state determiner 150 generates a message indicating any one or any combination of two or more of: that the battery set is possibly defective, a message indicating that a replacement of the battery set is required, a message indicating that a replacement of a battery having an internal resistance estimated to be greater than the threshold is required. The state determiner 150 outputs the feedback information to be displayed on a display and/or forwards the message for automatic action.

When the internal resistance estimator 130 estimates internal resistances of the batteries with respect to the battery set including the batteries, the state determiner 150 counts an internal resistance estimated to be greater than the threshold among the estimated internal resistances. The state determiner 150 determines a feedback level based on a counting result. When the feedback level is determined, the state determiner 150 performs a feedback based on a feedback method corresponding to the feedback level. When internal resistances of n batteries are estimated as $R_{d1\_t}$, $R_{d2\_t}$, ..., $R_{dn\_t}$ and $R_{d1\_t}$, $R_{d2\_t}$, and $R_{d3\_t}$ are greater than the threshold, the state determiner 150 determines "a number of internal resistances estimated to be greater than the threshold=3". The state determiner 150 determines a feedback level of "the number of internal resistances estimated to be greater than the threshold=3" to be a level 2 as shown in Table 1 below.

TABLE 1

| Number of internal resistances estimated to be greater than threshold | Feedback level | Feedback method |
|---|---|---|
| 1~2 | Level 1 | 1. Number of feedback outputs = $n_1$ |
| 3~4 | Level 2 | 1. Number of feedback outputs = $n_2$<br>2. Transmit state information of battery set to terminal |
| 5~8 | Level 3 | 1. Feedback count = $n_3$<br>2. Transmit state information of battery set to terminal and management or service center |
| ... | ... | ... |

When the feedback level is determined as the level 2, the state determiner 150 performs the feedback based on a feedback method corresponding to the level 2. For example, the state determiner 150 outputs a visual feedback and/or an auditory feedback $n_2$ times and transmits a message indicating that the state of the battery set is currently determined as the abnormal state to a terminal.

Figure 2:
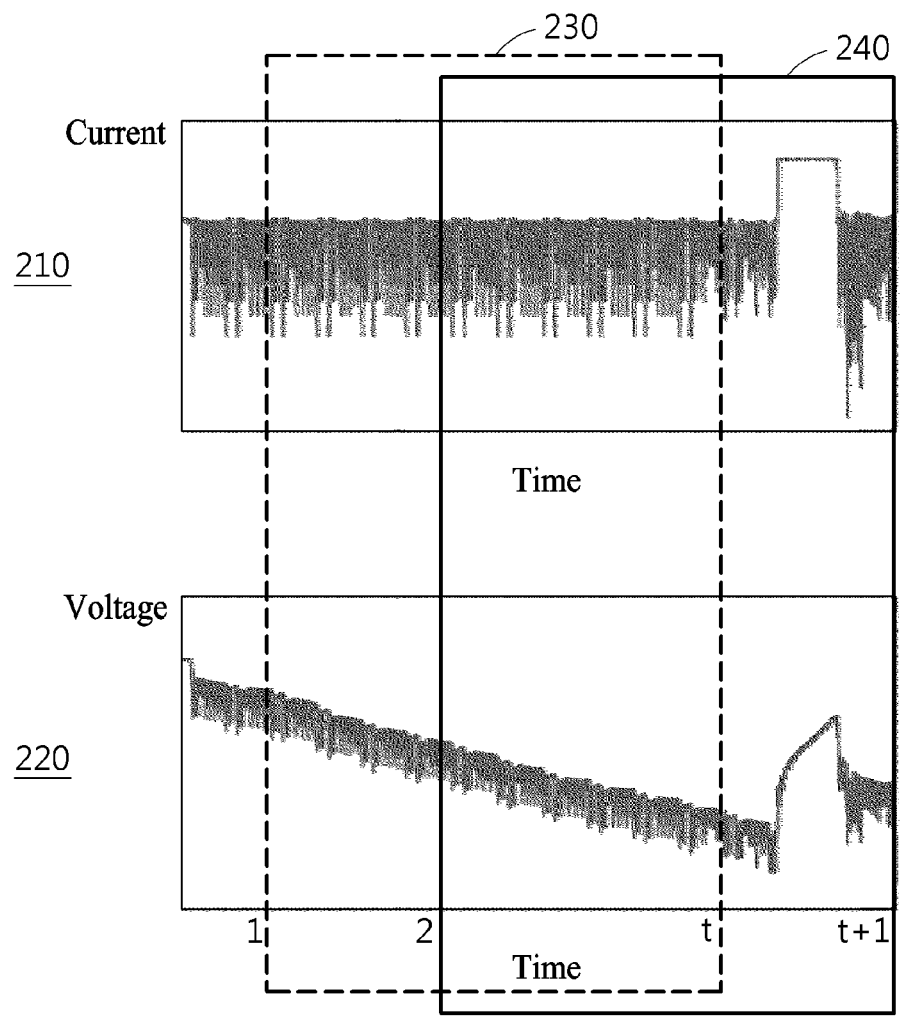
FIGS. 2 and 3 illustrate an example of estimating an internal resistance in a battery management apparatus.
Figure 3:
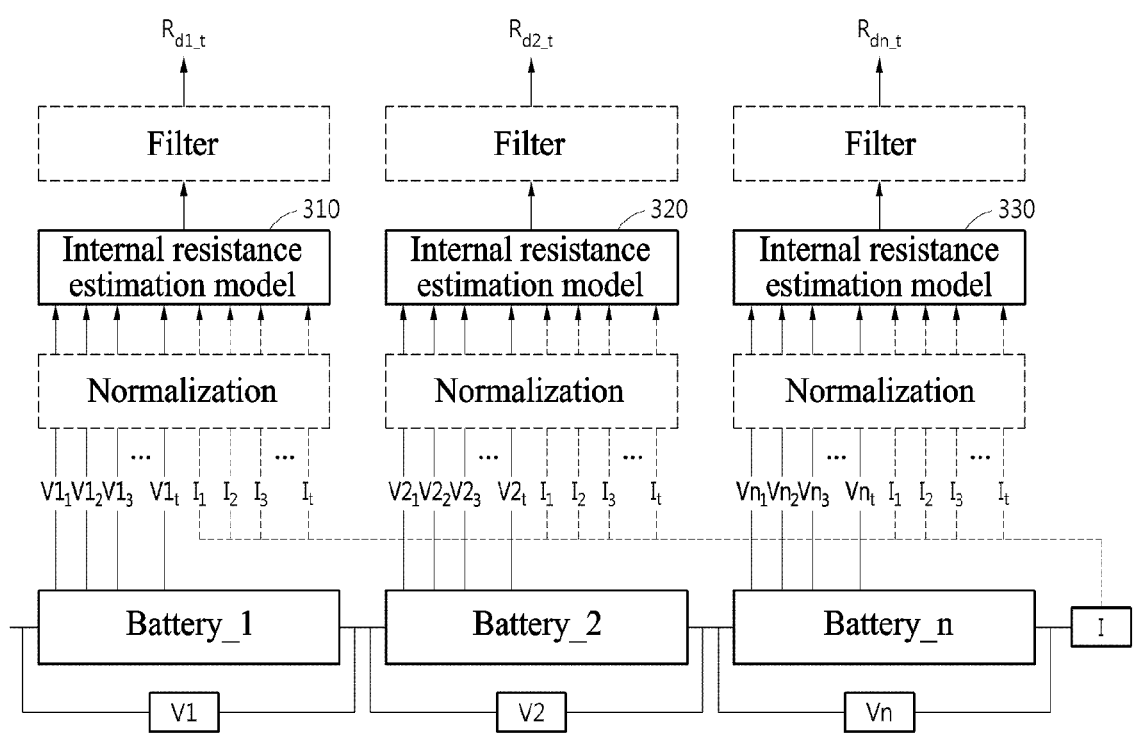

FIGS. 2 and 3 illustrate an example of a method of estimating an internal resistance in a battery management apparatus.

Hereinafter, a battery management apparatus estimating internal resistances of batteries included in a battery set will be described with reference to FIGS. 2 and 3. The following description is also applicable to a case in which a battery set includes a single battery.

Referring to FIG. 2, a current 210 of a battery set and a voltage of a battery_1 included in the battery set are illustrated. When a point in time is a time t, the battery set is being discharged.

A current sensor of the battery set transmits current data $I_t$ to the battery management apparatus 100. The receiver 110 receives the current data $I_t$ from the current sensor. The receiver 110 stores the current data $I_t$ in a buffer.

A voltage sensor of the battery_1 transmits voltage data $V1_t$ to the battery management apparatus 100. The receiver 110 receives the voltage data $V1_t$ from the voltage sensor of the battery_1. The receiver 110 stores the voltage data $V1_t$ in the buffer. Likewise, the receiver 110 receives voltage data $V2_t$ from a voltage sensor of a battery_2, and stores the voltage data $V2_t$ in the buffer. Also, the receiver 110 receives voltage data $Vn_t$ from a voltage sensor of a battery_n, and stores the voltage data $Vn_t$ in the buffer.

Table 2 represents an example of physical quantity data stored in the buffer at the time t.

TABLE 2

| Current of battery set | $I_1$ | $I_2$ | ... | $I_t$ |
|---|---|---|---|---|
| Voltage of battery_1 | $V_{11}$ | $V_{12}$ | ... | $V_{1t}$ |
| Voltage of battery_2 | $V_{21}$ | $V_{22}$ | ... | $V_{2t}$ |
| Voltage of battery_n | $V_{n1}$ | $V_{n2}$ | ... | $V_{nt}$ |

In the buffer, physical quantity data corresponding to a size of a time window 230 is stored.

When the buffer is full at the time t, the battery management apparatus 100 estimates an internal resistance of the battery_1 corresponding to the time t based on a voltage data sequence $V1_1$ through $V1_t$ of the battery_1 and a current data sequence $I_1$ through $I_t$ of the battery set. Also, the battery management apparatus 100 estimates an internal resistance of the battery_2 corresponding to the time t based on a voltage data sequence $V2_1$ through $V2_t$ and a current data sequence $I_1$ through $I_t$, and estimates an internal resistance of the battery_n corresponding to the time t based on a voltage data sequence $Vn_1$ through $Vn_t$ and a current data sequence $I_1$ through $I_t$. Hereinafter, an example of estimating the internal resistances of the battery_1, the battery_2, and the battery_n will be described with reference to FIG. 3.

The preprocessor 120 preprocesses the voltage data sequence $V1_1$ through $V1_t$, the voltage data sequence $V2_1$ through $V2_t$, the voltage data sequence $Vn_1$ through $Vn_t$, and the current data sequence $I_1$ through $I_t$. For example, as illustrated in FIG. 3, the preprocessor 120 normalizes the voltage data sequence $V1_1$ through $V1_t$, the voltage data sequence $V2_1$ through $V2_t$, the voltage data sequence $Vn_1$ through $Vn_t$, and the current data sequence $I_1$ through $I_t$.

The internal resistance estimator 130 inputs the preprocessed voltage data sequence $V1_1$ through $V1_t$ and the preprocessed current data sequence $I_1$ through $I_t$ to an internal resistance estimation model 310 corresponding to the battery_1. Likewise, the internal resistance estimator 130 inputs the preprocessed voltage data sequence $V2_1$ through $V2_t$ and the preprocessed current data sequence $I_1$ through $I_t$ to an internal resistance estimation model 320 corresponding to the battery_2, and inputs the preprocessed voltage data sequence $Vn_1$ through $Vn_t$ and the preprocessed current data sequence $I_1$ through $I_t$ to an internal resistance estimation model 330 corresponding to the battery_n. In this example, the preprocessed current data sequence $I_1$ through $I_t$ is input to the internal resistance estimation models 310 through 330. That is, the preprocessed current data sequence $I_1$ through $I_t$ corresponds to common input data of the internal resistance estimation models 310 through 330.

As described with reference to FIG. 2, the battery_1, the battery_2, and the battery_n are discharged at the time t.

That is, a current is flowing through each of the batteries. As expressed by Equation 1, an internal resistance R of a battery includes an internal resistance $R_i$ associated with a current and an internal resistance $R_d$ associated with a degradation in the battery.

$$R=R_d+R_i \qquad \text{[Equation 1]}$$

R denotes an internal resistance of a battery. While the battery is being discharged, the internal resistance of the battery is classified into the internal resistance $R_d$ associated with the degradation in the battery and the internal resistance $R_i$ forcibly generated due to an inflow of the current.

$R_i$ denotes an internal resistance that is temporarily generated due to a current. When the battery is in a stabilized state instead of being discharged, the internal resistance $R_i$ is zero. Thus, the internal resistance $R_i$ may not be used to determine a battery life.

$R_d$ denotes an internal resistance associated with a degradation in a battery. The internal resistance $R_d$ is present even when the battery is in the stabilized state. Also, as a charging and discharging cycle of the battery is iterated, the internal resistance $R_d$ increases. That is, the internal resistance $R_d$ increases as the battery is used. Thus, the internal resistance $R_d$ is associated with a battery life.

The internal resistance estimator 130 estimates the internal resistance $R_d$ instead of the internal resistance R including the internal resistance $R_i$ using the internal resistance estimation models 310 through 330. Each of the internal resistance estimation models 310 through 330 corresponds to a model in which an internal resistance change associated with a battery degradation is modeled. Thus, using the internal resistance estimation models 310 through 330, an estimated value of an internal resistance associated with the degradation at a specific point in time for each battery based on an input data sequence. As such, each of the internal resistance estimation models 310 through 330 calculates an estimated value of an internal resistance associated with the degradation based on a voltage data sequence of each battery and a current data sequence of a battery set. In this example, a time index of the calculated estimated value corresponds to a time index of last data of the voltage data sequence and a time index of last data of the current data sequence. Also, the internal resistance estimation models 310 through 330 are trained, and related description will be provided later.

In the example of FIG. 3, the internal resistance estimator 130 estimates an internal resistance associated with a degradation in the battery_1 at a point in time corresponding to a time index t of the voltage $V1_t$ and the current $I_t$ which are the last data of the preprocessed voltage data sequence $V1_1$ through $V1_t$ and the preprocessed current data sequence $I_1$ through $I_t$, respectively. The internal resistance estimator 130 estimates the internal resistance associated with the degradation in the battery_1 at a point in time t using the internal resistance estimation model 310 based on the preprocessed voltage data sequence $V1_1$ through $V1_t$ and the preprocessed current data sequence $I_1$ through $I_t$. Likewise, the internal resistance estimator 130 estimates an internal resistance associated with a degradation in the battery_2 at the point in time t using the internal resistance estimation model 320 based on the preprocessed voltage data sequence $V2_1$ through $V2_t$ and the preprocessed current data sequence $I_1$ through $I_t$. Also, the internal resistance estimator 130 estimates an internal resistance associated with a degradation in the battery_n at the point in time t using the internal resistance estimation model 330 based on the preprocessed voltage data sequence $Vn_1$ through $Vn_t$ and the preprocessed current data sequence $I_1$ through $I_t$. In other words, the internal resistance estimation model 310 calculates an estimated value $R_{d1\_t}$ of the internal resistance $R_d$ associated with the degradation in the battery_1 at the point in time t. Likewise, the internal resistance estimation model 320 calculates an estimated value $R_{d2\_t}$, and the internal resistance estimation model 330 calculates an estimated value $R_{dn\_t}$.

The postprocessor 140 postprocesses the internal resistances estimated by the internal resistance estimator 130. In the example of FIG. 3, the postprocessor 140 filters the estimated values $R_{d1\_t}$, $R_{d2\_t}$, and $R_{dn\_t}$.

The receiver 110 receives voltage data $V1_{t+1}$ corresponding to a point in time t+1 from the voltage sensor of the battery_1. Likewise, the receiver 110 receives voltage data $V2_{t+1}$ from the voltage sensor of the battery_2 and receives voltage data $Vn_{t+1}$ from the voltage sensor of the battery_n. Also, the receiver 110 receives current data $I_{t+1}$ corresponding to the point in time t+1 from the current sensor of the battery set.

When the buffer is full, the receiver 110 removes the most previous physical quantity data, for example, the voltage data $V1_1$, $V2_1$, and $Vn_1$, and the current data $I_1$, and stores the voltage data $V1_{t+1}$, $V2_{t+1}$, and $Vn_{t+1}$, and the current data $I_{t+1}$ in the buffer. Table 3 represents an example of physical quantity data stored in the buffer at the point in time t+1.

TABLE 3

| Current of battery set | $I_2$ | $I_3$ | ... | $I_{t+1}$ |
|---|---|---|---|---|
| Voltage of battery_1 | $V_{12}$ | $V_{13}$ | ... | $V_{1t+1}$ |
| Voltage of battery_2 | $V_{22}$ | $V_{23}$ | ... | $V_{2t+1}$ |
| Voltage of battery_n | $V_{n2}$ | $V_{n3}$ | ... | $V_{nt+1}$ |

In the buffer, physical quantity data corresponding to a size of a time window 240 is stored.

The preprocessor 120 preprocesses the voltage data $V1_2$ through $V1_{t+1}$, the voltage data $V2_2$ through $V2_{t+1}$, the voltage data $Vn_2$ through $Vn_{t+1}$, and the current data $I_2$ through $I_{t+1}$. The internal resistance estimator 130 estimates the internal resistance of the battery_1 at the point in time t+1 using the internal resistance estimation model 310 based on the preprocessed voltage data $V1_2$ through $V1_{t+1}$ and the preprocessed current data $I_2$ through $I_{t+1}$. Likewise, the internal resistance estimator 130 estimates the internal resistance of the battery_2 and the internal resistance of the battery_n corresponding to the point in time t+1. In other words, the internal resistance estimator 130 uses the internal resistance estimation model 310 to calculate an estimated value $R_{d1\_t+1}$ of the internal resistance $R_d$ associated with the degradation in the battery_1. Likewise, the internal resistance estimator 130 calculates an estimated value $R_{d2\_t+1}$ using the internal resistance estimation model 320 and calculates an estimated value $R_{dn\_t+1}$ using the internal resistance estimation model 330.

As described above, the battery management apparatus 100 estimates an internal resistance associated with a current degraded state of each battery in real time by using an internal resistance estimation model of the battery based on an input data sequence including current data of a battery set and voltage data of the battery while the battery is being used. Through this, the battery management apparatus 100 consistently determines whether the battery is abnormal based on the estimated internal resistance of the battery while the battery is being used. Also, the battery management apparatus 100 accurately estimates the internal resistance for each battery without need to use a device for measuring the internal resistance for each battery, thereby achieving a lightness of a system. The battery management apparatus 100 is applicable to a wide range, for example, a system configured to measure a voltage and a current.

Figure 4:
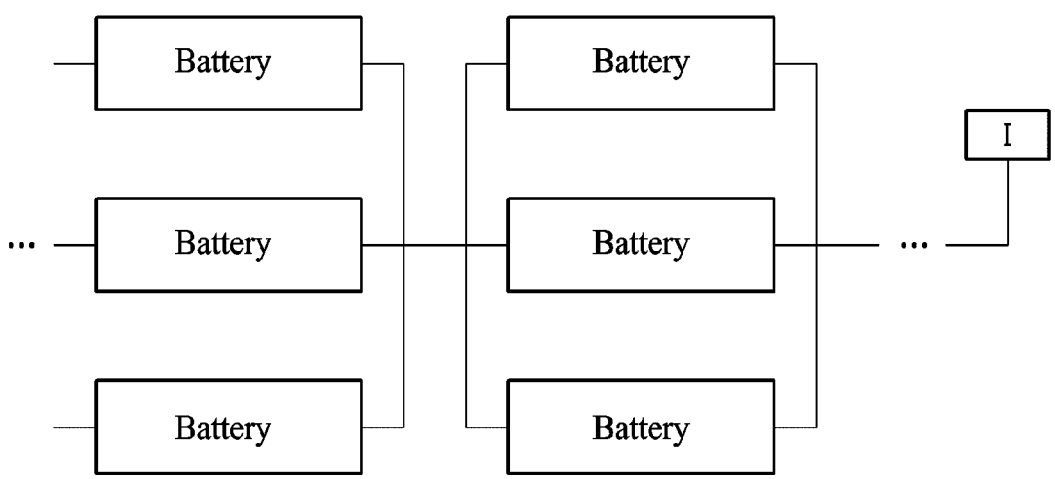
FIG. 4 illustrates an example of connecting batteries.

FIG. 3 illustrates batteries connected in series. However, the batteries connected in series is merely an example and a connection type of batteries is not limited to the example of FIG. 3. For example, as illustrated in FIG. 4, batteries connected in parallel form battery groups and the battery groups are connected in series. Also, depending on examples batteries are connected in parallel.

For example, the battery management apparatus 100 receives current data of each of the batteries from a current sensor of each of the batteries in the battery set. In this example, the battery management apparatus 100 preprocesses voltage data of each of the batteries and a current data and estimates the internal resistance of each of the batteries based on the preprocessed voltage data, the preprocessed current data, and an internal resistance estimation model corresponding to each of the batteries.

A battery management apparatus accurately estimates an internal resistance associated with a current degradation state of a battery using an internal resistance estimation model. The internal resistance estimation model is modeled or trained to be used in such estimation. Hereinafter, an example of modeling of the internal resistance estimation model is described.

Figure 5:
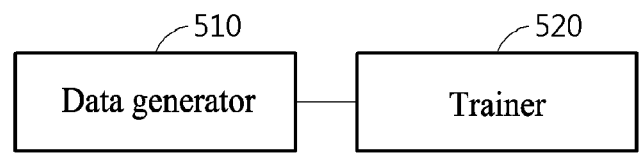
FIG. 5 illustrates a model generating system.

FIG. 5 illustrates a model generating system.

Referring to FIG. 5, a model generating system includes a data generator 510 and a trainer 520.

The data generator 510 and the trainer 520 are implemented in one or more embodiments by at least one processing device, for example, a controller.

In one or more embodiments, the data generator 510 and the trainer 520 are units that are logically distinguished in a single physical device. Also, in one or more embodiments, the data generator 510 and the trainer 520 are physical devices distinguished from each other.

The data generator 510 generates learning data. The learning data includes, for example, a voltage data sequence based on a voltage sensed while a reference battery is charged or discharged and a current data sequence based on a current sensed while the reference battery is charged or discharged.

Also, the data generator 510 generates a reference value set. For example, the data generator 510 generates a reference value set of an internal resistance of the reference battery being charged or discharged based on a calculation result of internal resistances measured in the reference battery.

An operation of the data generator 510 is described with reference to FIGS. 6 and 7.

The trainer 520 trains an internal resistance estimation model based on the learning data and the reference value set. For example, the trainer 520 preprocesses a voltage data sequence and a current data sequence of the reference battery. The trainer 520 calculates an estimated value of an internal resistance associated with a degradation in the reference battery based on the preprocessed voltage data sequence, the preprocessed current data sequence, and the internal resistance estimation model. The trainer 520 trains the internal resistance estimation model based on the estimated value and a reference value of the internal resistance. In this example, the reference value is included in the reference value set. Through such training, an internal resistance change due to a battery degradation is modeled to be an internal resistance estimation model. An operation of the trainer 520 is described with reference to FIG. 8.

Figure 6:
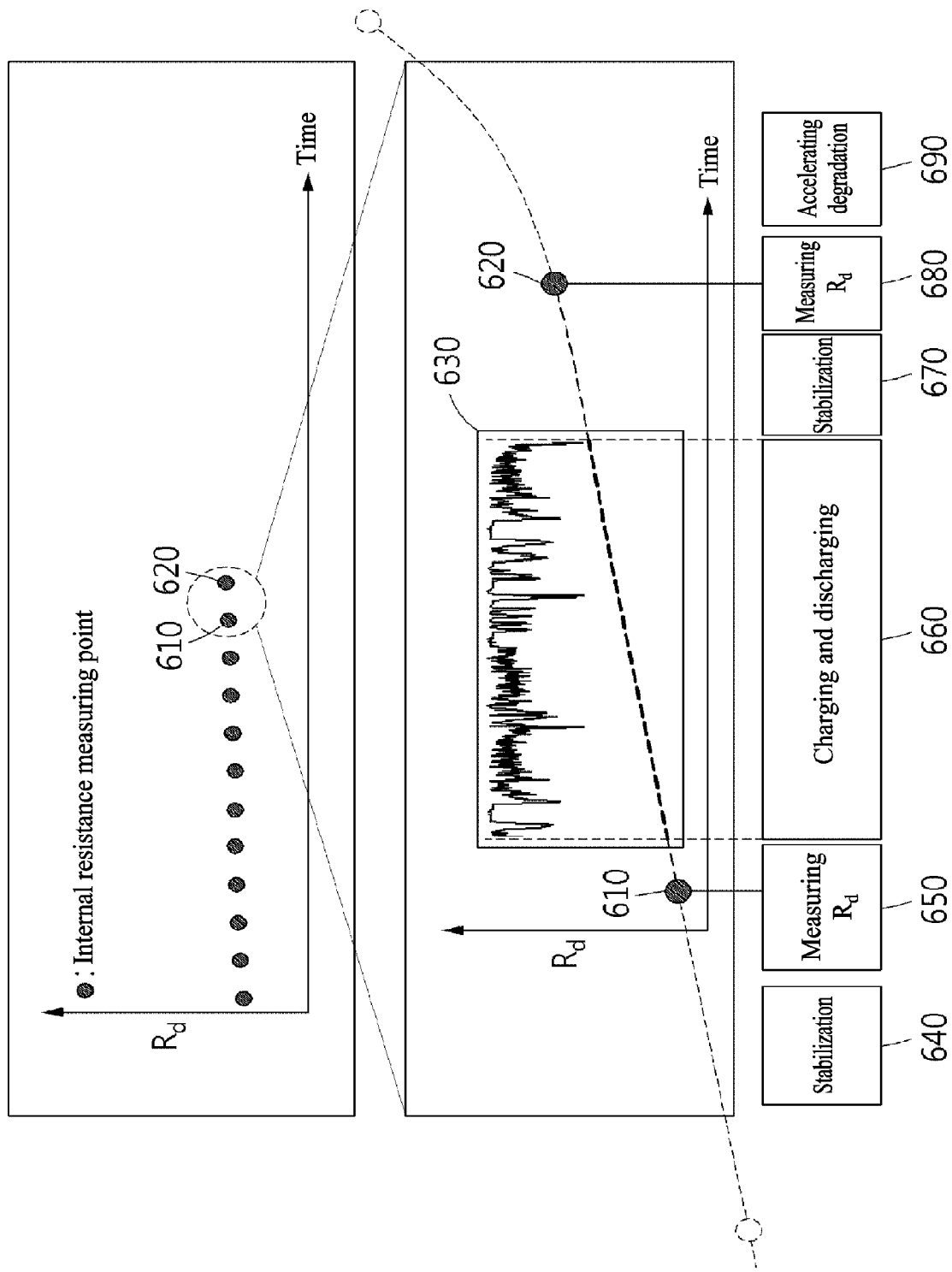
FIGS. 6 and 7 illustrate an example of an operation of a data generator in a model generating system.
Figure 7:
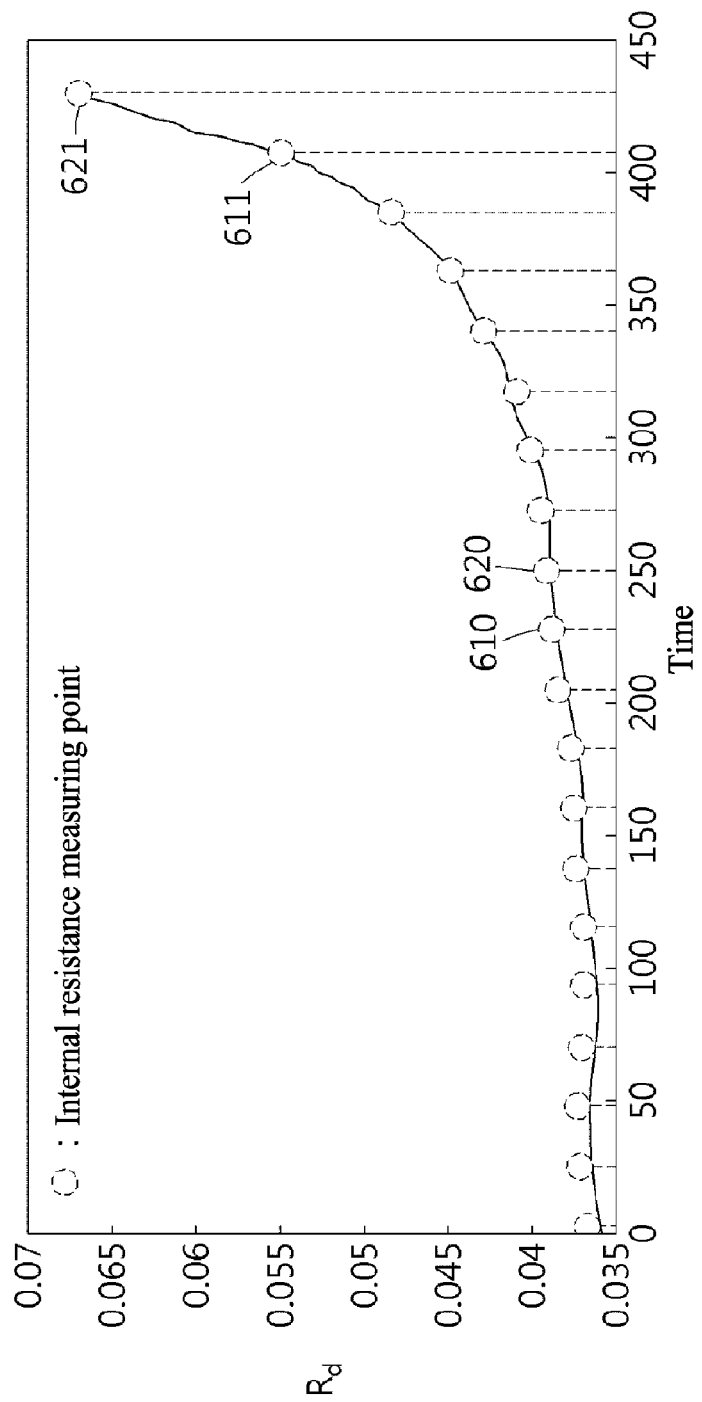

FIGS. 6 and 7 illustrate an example of an operation of a data generator in a model generating system.

FIG. 6 illustrates operations performed by the data generator 510 before an internal resistance is measured at an internal resistance measuring point 610, in an interval between the internal resistance measuring point 610 and an internal resistance measuring point 620, and after the internal resistance is measured at the internal resistance measuring point 620.

The data generator 510 stabilizes a reference battery in operation 640. For example, the data generator 510 stabilizes a reference battery to be in a relaxed state. In this example, the reference battery is a degradation-accelerated battery. An accelerated degradation is described further below.

When the reference battery is stabilized, the data generator 510 measures an internal resistance of the reference battery at the internal resistance measuring point 610 in operation 650. In other words, the data generator 510 measures an internal resistance of the reference battery being in the stabilized state after the accelerated degradation. For example, when the degradation-accelerated reference battery is stabilized, the data generator 510 applies a pulse current to the reference battery and measures the internal resistance of the reference battery.

The data generator 510 uses, for example, charges and/or discharges of the reference battery in operation 660. In FIG. 6, a current of the reference battery is represented in a graph 630. The data generator 510 senses a voltage and a current of the reference battery at an internal portion of a sensing period while the reference battery is being used. Through this, a voltage data sequence and a current data sequence of the reference battery being charged or discharged are generated. That is, the data generator 510 acquires a voltage data sequence and a current data sequence based on a charging or discharging of the reference battery in an interval between an internal resistance measuring point 610 and an internal resistance measuring point 620. In the example of FIG. 6, a sequence $V_{a1}$ through $V_{a2}$ and a sequence $I_{a1}$ through $I_{a2}$ are the voltage data sequence and the current data sequence corresponding to the interval between the internal resistance measuring point 610 and the internal resistance measuring point 620, respectively. The data generator 510 stores the sequence $V_{a1}$ through $V_{a2}$ and the sequence $I_{a1}$ through $I_{a2}$ in a memory. The sequence $V_{a1}$ through $V_{a2}$ and the sequence $I_{a1}$ and $I_{a2}$ are to be used for training an internal resistance estimation model.

When the use of the reference battery is terminated, the data generator 510 stabilizes the reference battery in operation 670. Stabilization includes, in one or more embodiments, resting the reference battery, or removing connection to load or a power supply for a predetermined time period to allow the reference battery to reach in an electrochemically stable state.

When the reference battery is stabilized, the data generator 510 measures the internal resistance of the reference battery at the internal resistance measuring point 620 in operation 680. In other words, the data generator 510 measures an internal resistance of the reference battery being in the stabilized state when the charging or discharging of the reference battery is terminated after the accelerated degradation.

The data generator 510 accelerates a degradation in the reference battery in operation 690. The data generator 510 accelerates the degradation in the degradation-accelerated reference battery again. For example, the data generator 510 exposes the reference battery having been exposed to a high temperature, for example, 80 degrees Celsius (° C.), to the high temperature again. Depending on examples, to accelerate the degradation in the reference battery, the data generator 510 overcharges or over-discharges the reference battery in operation 660.

The data generator 510 may repetitively perform operations 640 through 690. The data generator 510 performs operations 640 through 690 by the predetermined number of times, for example, 10 times. Also, the data generator 510 repetitively performs operations 640 through 690 until the end of life of the reference battery.

The data generator 510 measures a last internal resistance of the reference battery. FIG. 7 illustrates a first internal resistance measuring point through a last internal resistance measuring point 621.

In a memory, voltage data sequences and current data sequences corresponding to intervals between internal resistance measuring points are stored. Table 4 represents data stored in the memory.

TABLE 4

|  | $1^{st}$ point~ $2^{nd}$ point | $2^{nd}$ point~ $3^{rd}$ point | ... | Point 610~ point 620 | ... | Point 611~ point 621 |
|---|---|---|---|---|---|---|
| Current | $I_1$~$I_{t1}$ | $I_{t2}$~$I_{t3}$ | ... | $I_{a1}$~$I_{a2}$ | ... | $I_{n1}$~$I_{n2}$ |
| Voltage | $V_1$~$V_{t1}$ | $V_{t2}$~$V_{t3}$ | ... | $V_{a1}$~$V_{a2}$ | ... | $V_{n1}$~$V_{n2}$ |

In Table 4, "$1^{st}$ point~$2^{nd}$ point" is an interval between the first internal resistance measuring point and a second internal resistance measuring point. Also, "$I_1$~$I_{t1}$" and "$V_1$~$V_{t1}$," are respectively a current data sequence and a voltage data sequence of the reference battery being charged or discharged in the interval between the first internal resistance measuring point and the second internal resistance measuring point.

"$I_1$~$I_{t1}$", "$V_1$~$V_{t1}$", and the like correspond to learning data of an internal resistance estimation model.

Also, the data generator 510 performs calculation based on the measured internal resistances and generates a reference value set for an internal resistance of the reference battery being charged or discharged. For example, the data generator 510 performs interpolation on the internal resistances measured at the internal resistance measuring points of FIG. 7 and generates a reference value set based on a result of the interpolation. The interpolation is, for example, a linear interpolation, a polynomial interpolation, or a spline interpolation but not limited thereto.

A graph of FIG. 7 represents an example of an interpolation result, and Table 5 represents a reference set generated based on the interpolation result.

TABLE 5

|  | $1^{st}$ point~ $2^{nd}$ point | $2^{nd}$ point~ $3^{rd}$ point | ... | Point 610~ point 620 | ... | Point 611~ point 621 |
|---|---|---|---|---|---|---|
| Interpolation result | $R_{d\_1}$~$R_{d\_t1}$ | $R_{d\_t2}$~$R_{d\_t3}$ | ... | $R_{d\_a1}$~$R_{d\_a2}$ | ... | $R_{d\_n1}$~$R_{d\_n2}$ |

The data generator 510 performs the interpolation based on the internal resistance measured in operation 650 and the internal resistance measured in operation 680 and generates $R_{d\_a1}$ through $R_{d\_a2}$ corresponding to a time index of a current data sequence $I_{a1}$ through $I_{a2}$ and a time index of a voltage data sequence $V_{a1}$ through $V_{a2}$. In this example, the internal resistance measured in operation 650 is an internal resistance corresponding to the internal resistance measuring point 610 at which the reference battery is in a stabilized state after the accelerated degradation, and the internal resistance measured in operation 680 is an internal resistance corresponding to the internal resistance measuring point 620 at which the reference battery is in the stabilized state after the degradation in the reference battery is accelerated and charging or discharging of the degradation-accelerated reference battery is terminated. For example, through the interpolation, the data generator 510 generates $R_{d\_a1}$ corresponding to a time index a1 of $I_{a1}$ and $V_{a1}$ and $R_{d\_a1+t}$ corresponding to a time index a1+t of $I_{a1+t}$ and $V_{a1+t}$. Likewise, the data generator 510 generates "$R_{d\_t2}$~$R_{d\_t3}$", ..., "$R_{d\_n1}$~$R_{d\_n2}$".

When the learning data and the reference value set are generated, the trainer 520 trains the internal resistance estimation model based on the learning data and the reference value set. Hereinafter, an operation of the trainer 520 will be described with reference to FIG. 8.

Figure 8:
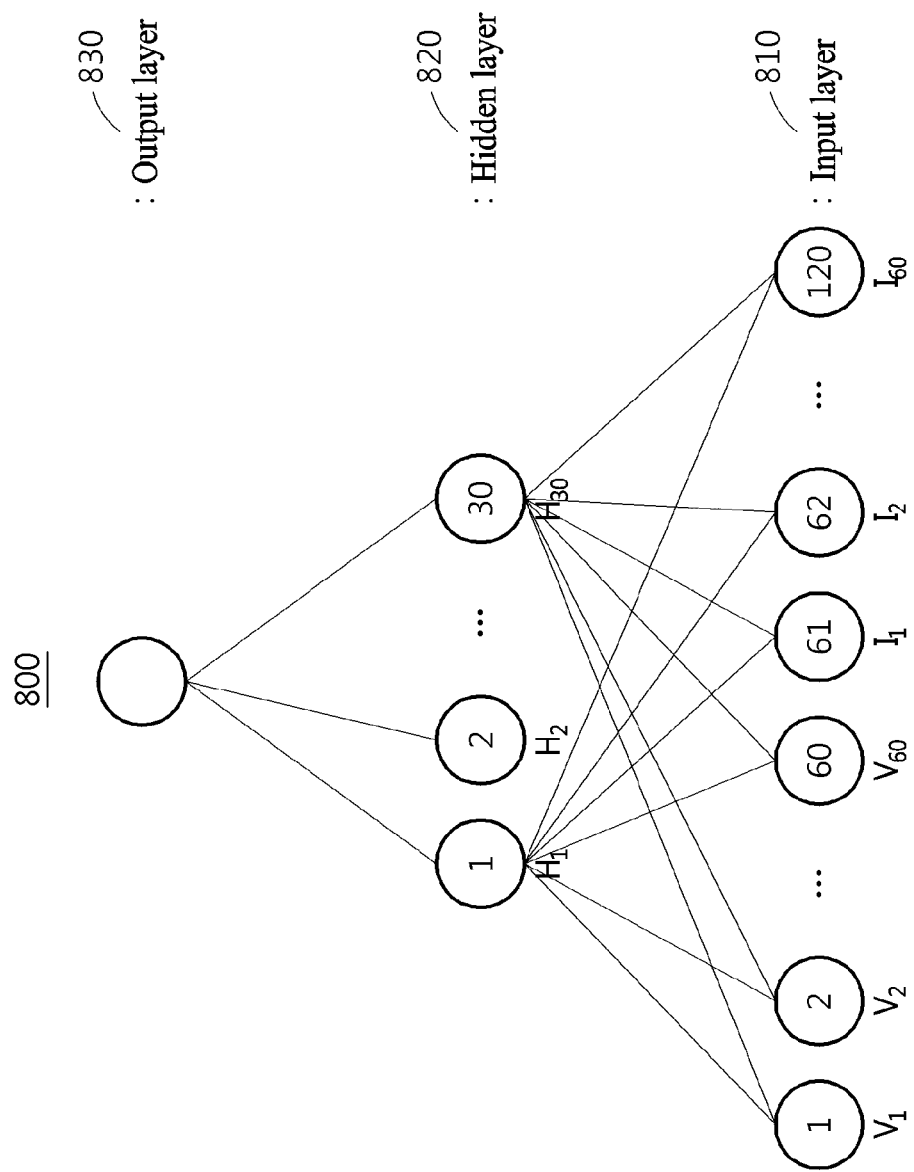
FIG. 8 illustrates an example of an operation of a trainer in a model generating system.

FIG. 8 illustrates an example of an operation of a trainer in a model generating system.

Referring to FIG. 8, an internal resistance estimation model based on a neural network 800 is illustrated.

The neural network 800 includes an input layer 810, a hidden layer 820, an output layer 830. Depending on examples, the neural network 800 includes a plurality of hidden layers. Each of the input layer 810, the hidden layer(s) 820, and the output layer 830 includes at least one artificial neuron. The at least one artificial neuron is connected to at least one artificial neuron of an adjacent layer through a connection line. In this example, the connection line has a connection weight. When learning data is input to the neural network 800, a forward computation is performed, and then an output value is generated in the output layer 830. For example, the learning data is multiplied by or added to the connection weight while being transmitted from the input layer 810 through the hidden layer 820 to the output layer 830. Through this, the output value is generated in the output layer 830.

In the example of FIG. 8, the trainer 520 preprocesses a voltage data sequence $V_1$ through $V_{60}$ and a current data sequence $I_1$ through $I_{60}$. The trainer 520 normalizes the voltage data sequence $V_1$ through $V_{60}$ and the current data sequence $I_1$ through $I_{60}$. The voltage data sequence $V_1$ through $V_{60}$ and the current data sequence $I_1$ through $I_{60}$ are each learning data and respectively represent a portion of the voltage data sequence and a portion of the current data sequence corresponding to an interval between a $1^{st}$ point and a $2^{nd}$ point. The trainer 520 inputs the preprocessed voltage data sequence $V_1$ through $V_{60}$ and the preprocessed current data sequence $I_1$ through 160 to the input layer 810.

A node_1 through a node_60 of the input layer 810 receive the voltage data sequence $V_1$ through $V_{60}$. A node_61 through a node_120 of the input layer 810 receive the current data sequence $I_1$ through $I_{60}$. When the preprocessed voltage data sequence $V_1$ through $V_{60}$ and the preprocessed current data sequence $I_1$ through $I_{60}$ are input to the input layer 810, a forward computation is performed, and the estimated value of an internal resistance of a reference battery is generated in the output layer 830. When the estimated value is $IR_{60}$, the trainer 520 postprocesses, for example, filters the estimated value $IR_{60}$.

The trainer 520 trains an internal resistance estimation model through an error backpropagation learning. The error backpropagation learning is a method of calculating an error between a reference value and an estimated value, propagates the error in a direction from the output layer 830 through the hidden layer 820 to the input layer 810, and updating a connection weight to reduce the error. For example, the trainer 520 selects $R_{d\_60}$ corresponding to the same point in time as that of the estimated value $IR_{60}$ from a reference value set and calculates an error between $R_{d\_60}$ and the estimated value $IR_{60}$. The trainer 520 back-propagates the calculated error and updates connection weights.

The trainer 520 changes a portion of data in the input data sequence. For example, the trainer 520 removes $V_1$ from the voltage data sequence $V_1$ through $V_{60}$ and adds $V_{61}$ to the voltage data sequence. The trainer 520 removes $I_1$ from the current data sequence $I_1$ through $I_{60}$ and adds $I_{61}$ to the current data sequence.

The trainer 520 preprocesses the voltage data sequence $V_2$ through $V_{61}$ and the current data sequence $I_2$ through $I_{61}$ and inputs the preprocessed voltage data sequence $V_2$ through $V_{61}$ and the preprocessed current data sequence $I_2$ through $I_{61}$. The voltage data sequence $V_2$ through $V_{61}$ is input to the node_1 through the node_60 of the input layer 810, and the current data sequence $I_2$ through $I_{61}$ is input to the node_61 through the node_120. When the preprocessed voltage data sequence $V_2$ through $V_{61}$ and the preprocessed current data sequence $I_2$ through $I_{61}$ are input to the input layer 810, an estimated value $IR_{61}$ is obtained through the forward computation. The trainer 520 selects $R_{d\_61}$ corresponding to the same point in time as that of the estimated value $IR_{61}$ from the reference value set and calculates an error between $R_{d\_61}$ and the estimated value $IR_{61}$. The trainer 520 back-propagates the error and updates connection weights.

The trainer 520 repetitively performs a process of performing the forward computation using the input data sequence, back-propagating the error, and changing a portion of data in the input data sequence, thereby optimizing the connection weights. The optimized connection weights are stored in the aforementioned battery management apparatus. The internal resistance estimation model in the battery management apparatus calculates an internal resistance of a battery in which a current is flowing based on the optimized connection weights, a voltage data sequence, and a current data sequence of the battery.

The internal resistance estimation model and the optimized connection weights are stored in a master-slave-structured battery management system as further discussed below.

Figure 9:
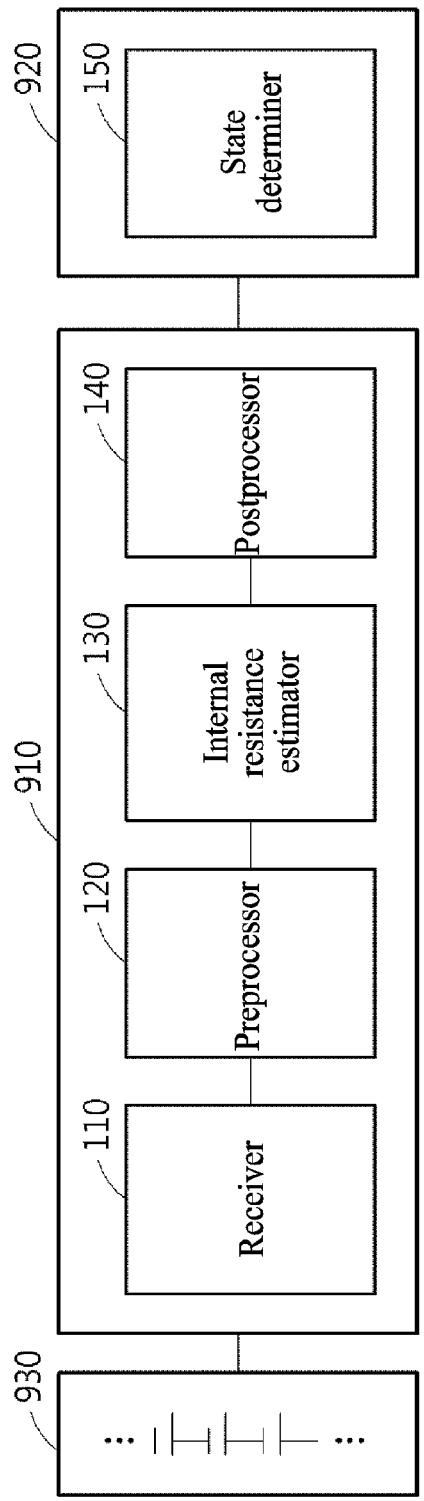
FIGS. 9 and 10 illustrate examples of a battery management system in a master-slave structure.
Figure 10:
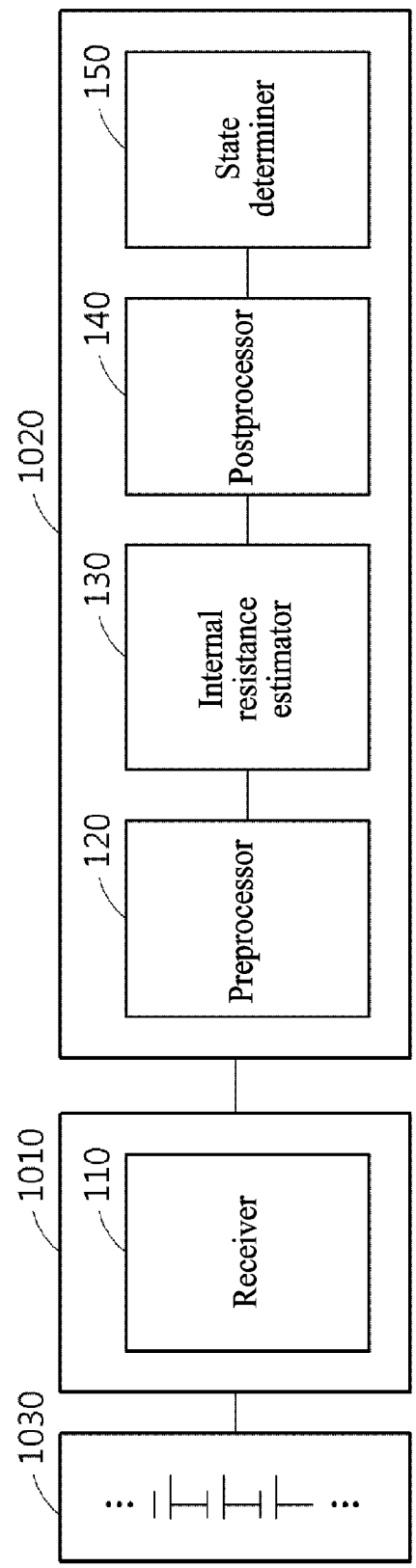

FIGS. 9 and 10 illustrate examples of a battery management system in a master-slave structure.

Referring to FIGS. 9 and 10, a battery management system includes a slave management apparatus 910 or 1010 and a master management apparatus 920 or 1020. Depending on examples, the slave management apparatus 910 or 1010 is provided as a plurality of slave management apparatuses.

The slave management apparatus 910 or 1010 manages and/or controls each of battery cells included in a battery pack 930 or 1030. The master management apparatus 920 or 1020 controls the slave management apparatus 910 or 1010.

The slave management apparatus 910 or 1010 and the master management apparatus 920 or 1020 performs the operations or functions of the battery management apparatus described above. Hereinafter, examples of FIGS. 9 and 10 are described.

In the example of FIG. 9, the slave management apparatus 910 includes the receiver 110, the preprocessor 120, the internal resistance estimator 130, and the postprocessor 140, and the master management apparatus 920 includes the state determiner 150. Also, the slave management apparatus 910 stores an internal resistance estimation model of each of the battery cells included in the battery pack 930. Operations of the slave management apparatus 910 and the master management apparatus 920 of FIG. 9 are as follows.

The slave management apparatus 910 receives voltage data of each of the battery cells included in the battery pack 930 from a voltage sensor of each of the battery cells at an interval of a sensing period. Through this, a voltage data sequence is generated for each of the battery cells. Also, the slave management apparatus 910 receives current data of the battery pack 930 from a current sensor of the battery pack 930 at an interval of a sensing period. Through this, a current data sequence of the battery pack 930 is generated. The slave management apparatus 910 preprocesses the voltage data sequence of each of the battery cells and the current data sequence of the battery pack 930. The slave management apparatus 910 estimates internal resistances of the battery cells. The slave management apparatus 910 preprocesses the internal resistances of the battery cells. The slave management apparatus 910 transmits each of the preprocessed internal resistances to the master management apparatus 920.

The master management apparatus 920 determines state information of the battery pack 930 based on at least one of the internal resistances estimated by the slave management apparatus 910.

Since the descriptions of FIGS. 1 through 8 are also applicable here, repeated descriptions of FIG. 9 are omitted for brevity and clarity.

Unlike the example of FIG. 9, in an example of FIG. 10, the slave management apparatus 1010 includes the receiver 110, and the master management apparatus 1020 includes the preprocessor 120, the internal resistance estimator 130, the postprocessor 140, and the state determiner 150. Also, the master management apparatus 1020 stores an internal resistance estimation model of each of the battery cells included in the battery pack 1030. Operations of the slave management apparatus 1010 and the master management apparatus 1020 of FIG. 10 are as follows.

The slave management apparatus 1010 receives voltage data of each of the battery cells included in the battery pack 1030 at an internal of a sensing period. Through this, a voltage data sequence of each of the battery cells is generated in the slave management apparatus 1010. The slave management apparatus 1010 transmits the voltage data sequence of each of the battery cells to the master management apparatus 1020. The master management apparatus 1020 receives the voltage data sequence of each of the battery cells from the slave management apparatus 1010. Also, the master management apparatus 1020 receives current data from a current sensor of the battery pack 1030 at an interval of a sensing period. Through this, a current data sequence of the battery pack 1030 is generated. The master management apparatus 1020 preprocesses the voltage data sequence of each of the battery cells and the current data sequence of the battery pack 1030. The master management apparatus 1020 estimates internal resistances of the battery cells. The master management apparatus 1020 postprocesses the internal resistances of the battery cells. The master management apparatus 1020 determines state information of the battery pack 1030 based on at least one of the estimated internal resistances.

Since the descriptions of FIGS. 1 through 8 are also applicable here, repeated descriptions of FIG. 10 are omitted for brevity and clarity.

Figure 11:
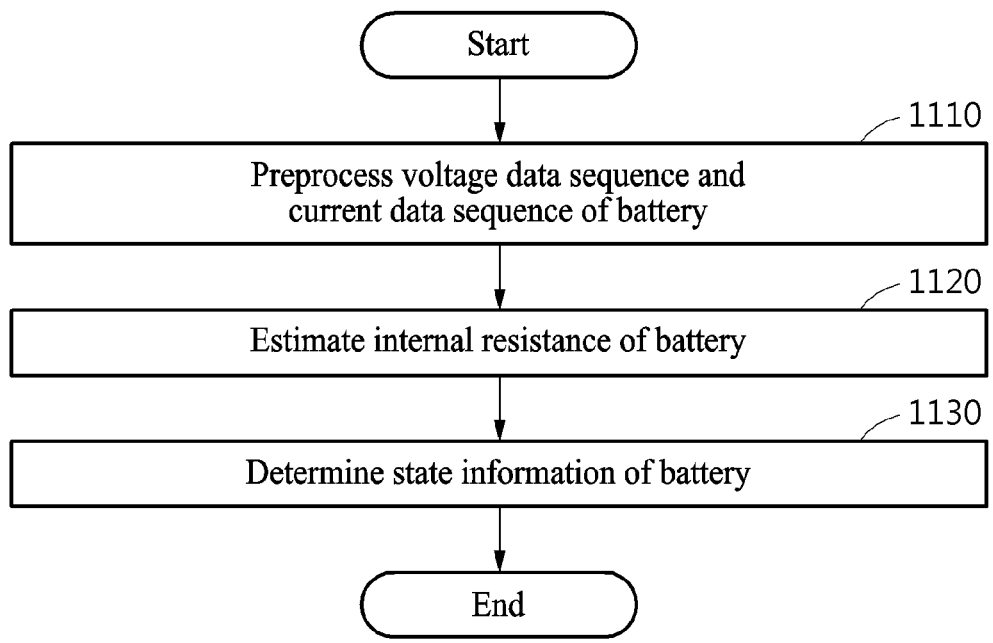
FIG. 11 illustrates an example of battery management.

FIG. 11 illustrates an example of a battery management method.

The battery management method is performed by the aforementioned battery management apparatus or battery management system.

Referring to FIG. 11, in operation 1110, the battery management apparatus preprocesses a voltage data sequence and a current data sequence of at least one battery.

In operation 1120, the battery management apparatus estimates an internal resistance of a battery based on the preprocessed voltage data sequence, the preprocessed current data sequence, and at least one internal resistance estimation model in which an internal resistance change due to a battery degradation is modeled.

In operation 1130, the battery management apparatus determines state information of the battery based on the estimated internal resistance.

The battery management apparatus is provided in a mobile body using an electric energy as a driving force. The mobile body is, for example, an electric vehicle. While the mobile body is travelling using the electric energy, the battery management apparatus estimates an internal resistance associated with a battery degradation using a corresponding internal resistance estimation model of a battery based on a voltage data sequence and a current data sequence of the battery. In this example, the battery management apparatus may not estimate an internal resistance generated due to a current.

Since the descriptions of FIGS. 1 through 10 are also applicable here, repeated descriptions of FIG. 11 are omitted for brevity and clarity.

Figure 12:
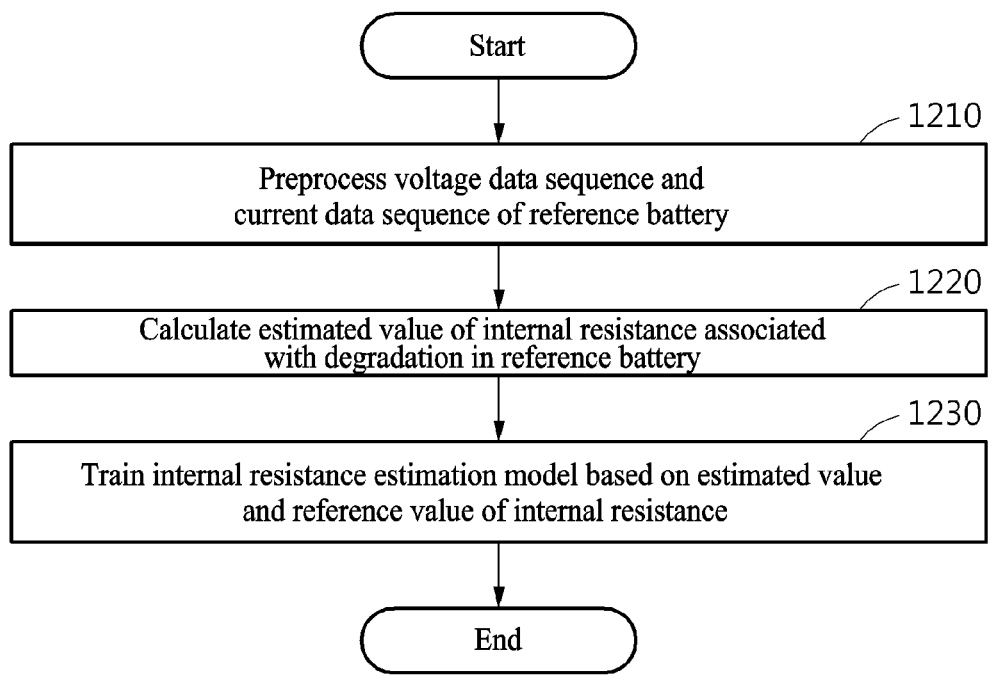
FIG. 12 illustrates an example of training an internal resistance estimation model.

FIG. 12 illustrates an example of a method of training an internal resistance estimation model.

The method of training an internal resistance estimation model is performed by the model generating system or the trainer in the model generating system as described above.

Referring to FIG. 12, in operation 1210, the model generating system preprocesses a voltage data sequence and a current data sequence of a reference battery.

In operation 1220, the model generating system calculates an estimated value of an internal resistance associated with a degradation in the reference battery based on the preprocessed data sequence, the preprocessed current data sequence, and an internal resistance estimation model.

In operation 1230, the model generating system trains the internal resistance estimation model based on the estimated value and a reference value of the internal resistance.

Since the descriptions of FIGS. 1 through 10 are also applicable here, repeated descriptions of FIG. 12 are omitted for brevity and clarity.

Figure 13:
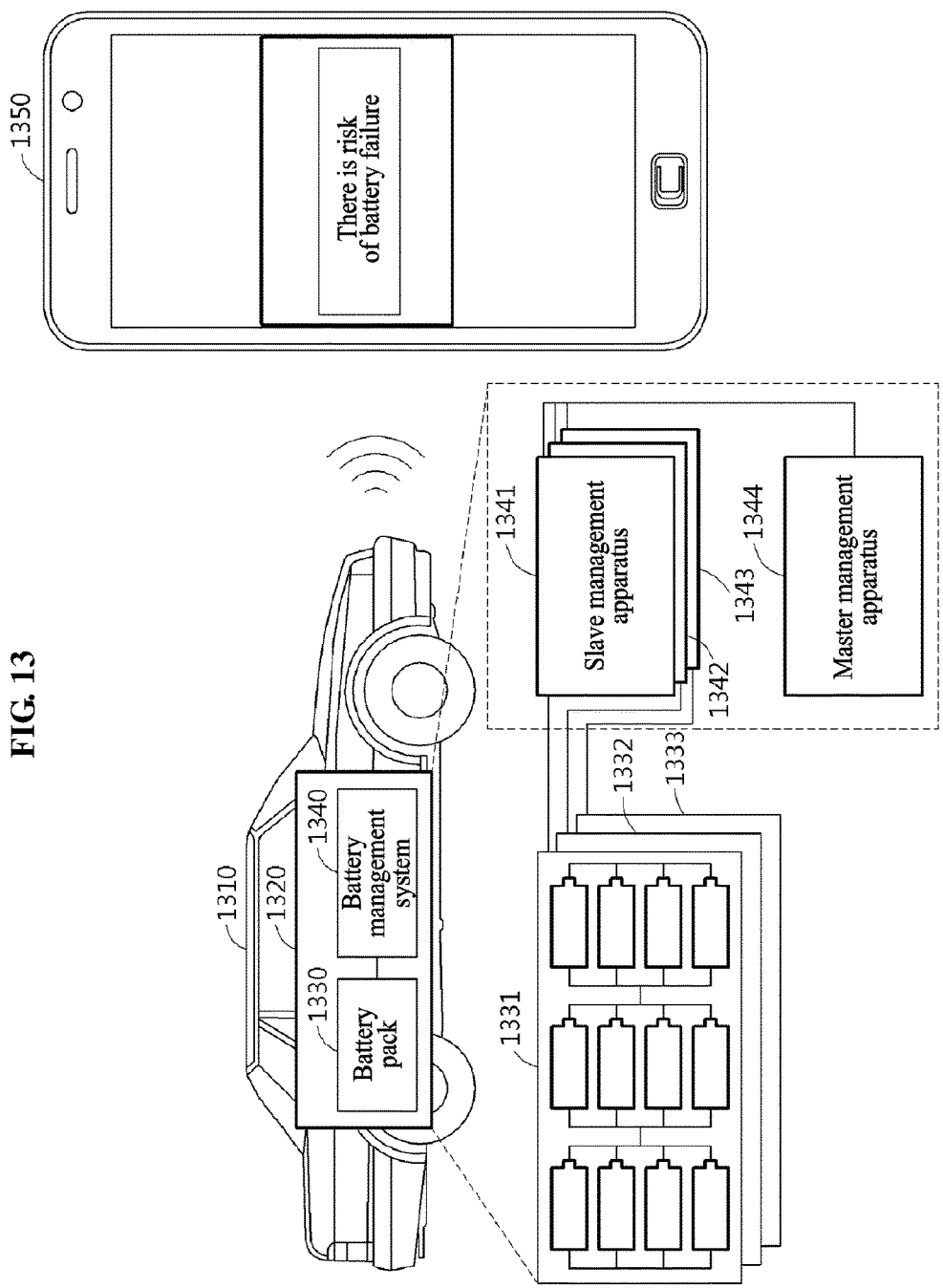
FIG. 13 illustrates an example of a vehicle.

FIG. 13 illustrates an example of a vehicle.

Referring to FIG. 13, a vehicle 1310 is a mobile body using an electric energy as a driving force. The vehicle 1310 is, for example, an electric vehicle or a hybrid vehicle.

The vehicle 1310 includes a battery system 1320.

The battery system 1320 includes a battery pack 1330 and a battery management system 1340. In an example of FIG. 13, the battery management system 1340 is located external to the battery pack 1330, which is merely an example. The battery management system 1340 is also located internal to the battery pack 1330, in one or more embodiments.

The battery pack 1330 includes battery modules 1331, 1332, and 1333. Each of the battery modules 1331, 1332, and 1333 includes at least one battery cell.

Slave management apparatuses 1341, 1342, and 1343, and a master management apparatus 1344 perform the operations and functions of the battery management apparatus as discussed above. For example, each of the slave management apparatuses 1341, 1342, and 1343 corresponds to the slave management apparatuses described with reference to FIG. 9 or 10. Also, the master management apparatus 1344 corresponds to the master management apparatus described with reference to FIGS. 9 and/or 10.

When the vehicle 1310 is travelling, the battery management system 1340 estimates an internal resistance of each of battery cells in the battery pack 1330 in real time. In this example, the internal resistance estimated in real time corresponds to an internal resistance associated with a current degraded state of the corresponding battery cell.

The master management apparatus 1344 transmits state information of the battery pack 1330 to a user terminal 1350 through a vehicle control unit (VCU) or electronic control unit (ECU). Also, the master management apparatus 1344 displays the state information of the battery pack 1330 on a display, for example, a dashboard and/or a head-up display (HUD) or auxiliary display/control unit such as a mobile device 1350 in the vehicle 1310 through the vehicle control unit. Depending on examples, the master management apparatus 1344 acoustically outputs the state information of the battery pack 1330 through the vehicle control unit.

Since the descriptions of FIGS. 1 through 12 are also applicable here, repeated descriptions of FIG. 13 are omitted for brevity and clarity.

The aforementioned battery management system or battery management system is included in a high-capacity battery management system, such as an energy storage system (ESS). Also, the battery management system or the battery management system is also included in a device management system or an electric device including a rechargeable battery. The battery management apparatus, the slave battery management apparatus, and the master battery management apparatus are each implemented in a form of a chip.

The receiver 110, preprocessor 120, internal resistance estimator 130, postprocessor 140, state determiner 150, data generator 510, trainer 520, neural network 800, VCU/ECU, battery management system 1340, slave management apparatus 1341, master management apparatus in FIGS. 1, 5, 8, 9, 10, and 13 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 3, 6, 11, and 12 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of managing a battery, the method comprising:
    preprocessing a voltage data sequence and a current data sequence of the battery;
    estimating an internal resistance of the battery based on the preprocessed voltage data sequence, the preprocessed current data sequence, and an internal resistance estimation model in which an internal resistance change due to a battery degradation is modeled; and
    determining state information of the battery based on the estimated internal resistance,
    wherein the voltage data sequence corresponds to a series of pieces of voltage data of the battery,
    the current data sequence corresponds to a series of pieces of current data of the battery, and the estimated internal resistance of the battery is an internal resistance estimated at a point in time corresponding to a time index of last voltage data of the voltage data sequence and a time index of last current data of the current data sequence.

2. The method of claim 1, wherein, in response to a battery set comprising batteries being provided, the preprocessing includes preprocessing a voltage data sequence of each of the batteries and a current data sequence of the battery set comprising the batteries, and the estimating comprises inputting the preprocessed current data sequence of the battery set to internal resistance estimation models, inputting the preprocessed voltage data sequence of each of the batteries to internal resistance estimation models corresponding to the batteries among the internal resistance estimation models, and estimating an internal resistance of each of the batteries.

3. The method of claim 1, wherein the estimating includes estimating the internal resistance of the battery in which a current is flowing using an internal resistance estimation model corresponding to the battery and estimating an internal resistance associated with the battery degradation instead of an internal resistance associated with the current.

4. The method of claim 1, wherein the internal resistance estimation model is trained based on a reference value and an estimated value, the reference value is included in a reference value set determined based on an interpolation result of internal resistances measured in a reference battery in which degradation is accelerated, and the estimated value corresponds to a result of a calculation performed by an untrained internal resistance estimation model based on input data including a voltage data sequence and a current data sequence of the reference battery.

5. The method of claim 4, wherein the internal resistances measured in the reference battery include an internal resistance measured in response to the reference battery being in a stabilized state after the degradation is accelerated and an internal resistance measured in response to the degradation-accelerated reference battery being in the stabilized state after being charged or discharged.

6. The method of claim 1, wherein the determining includes:
determining, in response to internal resistances being estimated for batteries included in a battery set, a maximal value from the estimated internal resistances; and
determining, in response to the maximal value being greater than a threshold, that an abnormality is present in the battery set.

7. The method of claim 1, wherein the determining includes:
comparing, in response to internal resistances being estimated for batteries included in a battery set, each of the estimated internal resistances to a threshold and determining whether an abnormality is present for each of the batteries; and
determining the state information of the battery set based on a result of the determining.

8. The method of claim 1, further comprising:
generating feedback information on a state of the battery set based on the determined state information.

9. The method of claim 8, wherein the generating of the feedback information includes:
polling the batteries, in response to internal resistances being estimated for batteries included in a battery set, an internal resistance estimated to be greater than a threshold among the estimated internal resistances; and
determining a feedback level based on a result of the polling.

10. The method of claim 1, wherein the preprocessing comprises:
normalizing the voltage data sequence and the current data sequence.

11. The method of claim 1, further comprising:
filtering the estimated internal resistance.

12. A non-transitory computer-readable storage medium storing program instructions that, when executed by a processor, cause the processor to perform the method of claim 1.

13. The method of claim 1, wherein the internal resistance estimation model includes a neural network.

14. The method of claim 1, further comprising outputting, to a terminal, a message indicating that the battery is defective or in an abnormal state, in response to determining that the battery is defective or in the abnormal state based on the determined state information.

15. A processor-implemented method of training an internal resistance estimation model, the method comprising:
preprocessing a voltage data sequence and a current data sequence;
calculating an estimated resistance value of an internal resistance associated with a degradation in a reference battery based on the preprocessed voltage data sequence, the preprocessed current data, and an internal resistance estimation model; and
training the internal resistance estimation model based on the estimated resistance value and a reference value of the internal resistance,
wherein the estimated resistance value is a value estimated for the internal resistance at a point in time corresponding to a time index of last voltage data of the preprocessed voltage data sequence and a time index of last current data of the preprocessed current data.

16. The method of claim 15, wherein the voltage data sequence and the current data sequence are based on a voltage and a current sensed during a charging or discharging of the reference battery in which a degradation is accelerated.

17. The method of claim 15, further comprising:
accelerating a degradation in the reference battery;
charging or discharging the degradation-accelerated reference battery;
sensing a voltage and a current of the charged or discharged reference battery; and
acquiring the voltage data sequence based on the sensed voltage and the current data sequence based on the sensed current.

18. The method of claim 15, further comprising:
generating a reference value set comprising the reference value by performing a calculation based on internal resistances measured in the reference battery.

19. The method of claim 18, wherein the generating includes:
performing an interpolation based on an internal resistance measured in the reference battery being in a stabilized state after the degradation is accelerated and an internal resistance measured in the degradation-accelerated reference battery being in the stabilized state after the degradation-accelerated reference battery is charged or discharged; and generating the reference value set based on a result of the interpolation.

20. The method of claim 15, wherein the preprocessing comprises normalizing the voltage data sequence and the current data sequence.

21. A battery management apparatus, comprising:
a controller; and
a memory storing one or more instructions, which when executed by the controller configure the controller to
preprocess a voltage data sequence and a current data sequence of a battery,
estimate an internal resistance of the battery based on the preprocessed voltage data sequence, the preprocessed current data sequence, and at least one internal resistance estimation model in which an internal resistance change due to a battery degradation is modeled, and
determine state information of the battery based on the estimated internal resistance,
wherein the voltage data sequence corresponds to a series of pieces of voltage data of the battery, the current data sequence corresponds to a series of pieces of current data of the battery, and the estimated internal resistance of the battery is an internal resistance estimated at a point in time corresponding to a time index of last voltage data of the voltage data sequence and a time index of last current data of the current data sequence.

22. The apparatus of claim 21, wherein the battery management apparatus is mounted on a mobile body using an electric energy as a driving force, and wherein while the mobile body is driven by the electric energy, the controller is configured to acquire the voltage data sequence and the current data sequence and estimate an internal resistance associated with a degraded state of the battery instead of an internal resistance due to a current associated with the electric energy.

* * * * *